SEMICONDUCTIVE DEVICE AND METHOD OF FABRICATION THEREOF

Filed Sept. 25, 1956 2 Sheets-Sheet 1

INVENTOR.
JOHN ROSCHEN
BY
[signature]
ATTORNEY

March 29, 1960 J. ROSCHEN 2,930,949
SEMICONDUCTIVE DEVICE AND METHOD OF FABRICATION THEREOF
Filed Sept. 25, 1956 2 Sheets-Sheet 2

INVENTOR.
JOHN ROSCHEN
BY
Allen V. Hazeltine
ATTORNEY

United States Patent Office 2,930,949

Patented Mar. 29, 1960

2,930,949

SEMICONDUCTIVE DEVICE AND METHOD OF FABRICATION THEREOF

John Roschen, Hatboro, Pa., assignor to Philco Corporation, Philadelphia, Pa., a corporation of Pennsylvania Application September 25, 1956, Serial No. 611,829

17 Claims. (Cl. 317—235)

This invention relates to improved semiconductive devices and to a novel method for fabricating them. More particularly, it relates to an improved surface-barrier transistor and to a novel method for fabricating it.

Prominent among those semiconductive signal-translating devices which are utilized to amplify high-frequency alternating currents is the surface-barrier transistor, whose structure is disclosed and claimed in the copending patent application Serial No. 472,826 of R. A. Williams and J. W. Tiley, filed December 3, 1954, entitled "Electrical Device," and assigned to the assignee of the present application, and now Patent No. 2,885,571. This form of transistor is characterized in that the width and configuration of its base region is substantially the same as that of the semiconductive body to which the emitter and collector electrodes are applied. Importantly, this semiconductive body can be shaped to the desired configuration and thickness with a high degree of precision, for example by utilizing the jet-electrolytic etching technique described and claimed in the copending patent application Serial No. 472,824 of J. W. Tiley and R. A. Williams, filed December 3, 1954, entitled "Semiconductive Devices and Methods for the Fabrication Thereof," and also assigned to the assignee of the present application. As a result, base regions of the dimensions necessary for satisfactory operation at high frequencies can be readily provided with an accuracy far greater than is possible in conventional devices in which the dimensions of the base region are critically dependent upon precise control of alloying processes. Moreover, by utilizing in addition the jet-electroplating technique described in the latter Tiley-Williams application, the emitter and collector elements of the surface-barrier transistor can be readily and accurately formed and positioned upon the pre-shaped semiconductive base. Because the surface-barrier transistor can be fabricated easily and is an excellent amplifier of high-frequency alternating currents, it has become a commercially important form of semiconductive signal-translating device.

In the course of vigorous environmental tests of such transistors, it has been observed that certain of their electrical characteristics may undergo a gradual change when the transistors are stored or used under conditions such that the surface-barrier electrodes and the portions of the semiconductive body contiguous thereto are maintained for long periods of time at elevated temperatures, e.g. of the order of 70° C. to 100° C. For example, it has been found that the punch-through voltage, and hence the maximum permissible collector voltage for common-emitter operation, of surface-barrier transistors exposed to elevated temperatures tend gradually to fall, while the base spreading resistance of these units tends gradually to rise. Moreover, the input capacitance of these transistors, as measured in the common-emitter configuration, tends gradually to rise, while their output resistance in this configuration tends gradually to fall. Although these long-time changes occurring at elevated temperatures may be of minor importance in many cases, in other applications it may be essential that the transistors have electrical characteristics which are substantially unaffected by exposure of the transistors to relatively high temperatures for long periods of time. A typical example of such an application occurs in the R-F and I-F circuits of transistorized automobile radios.

It is accordingly an object of my invention to provide an improved semiconductive device.

A further object is to provide a method for fabricating this improved semiconductive device.

An additional object is to provide an improved surface-barrier transistor and a novel method for fabricating it.

Another object is to provide an improved surface-barrier transistor, the electrical characteristics of which are substantially unaffected by extended storage or operation at high temperatures.

Still another object is to provide a method for fabricating a surface-barrier transistor, the electrical characteristics of which are substantially unaffected by extended storage or operation at high temperatures.

Yet another object is to provide a surface-barrier transistor which is particularly well suited for operation under high-temperature conditions.

A specific object is to provide a surface-barrier transistor, and a novel method for fabricating it, which transistor can be stored at elevated temperatures for many thousands of hours without undergoing any appreciable change in its electrical characteristics.

Another specific object is to provide a surface-barrier transistor which may be operated in high-temperature environments for extended periods of time without undergoing any substantial changes in its electrical characteristics.

A further specific object is to provide a surface-barrier transistor which may be operated for extended periods of time at current intensities such that the power dissipated by the transistor causes substantial heating thereof, said transistor nonetheless undergoing substantially no changes in its electrical characteristics.

In seeking to achieve the foregoing objects of my invention, I have discovered that the gradual change in the punchthrough voltage of some surface-barrier transistors which may occur when these transistors are exposed to a high temperature environment for extended periods of time, is produced by gradual dissolution, into the metal surface-barrier contacts, of the solid semiconductive material contiguous thereto. Both the rate of dissolution and the absolute quantity of semiconductive material dissolving, in solid solution, into the surface-barrier contact is very small because of the relatively low solid solubilities of the materials involved. Nonetheless, because the base width of a surface-barrier transistor is itself miniscule, e.g. of the order of 0.0001 inch, even a small amount of dissolution of the base material into both the emitter and collector contacts, with the concomitant advance of the metal into the semiconductive body, may correspond to a large reduction percentagewise in the width of the base region. Since the punchthrough voltage of a transistor varies directly as the square of the base width, this advance of the surface-barrier contact material into the semiconductive body is manifested by a gradual decline in the punchthrough voltage, and hence in the maximum permissible collector voltage of the transistor.

In accordance with my invention in one principal aspect, I provide an improved semiconductive device comprising a body of a semiconductive material and a surface-barrier electrode thereon, the latter electrode having as a major constituent a metal forming a surface-barrier when applied to the semiconductive body and, as a minor constituent, a material the same as that of the body. The device is fabricated, in accordance with my invention in another aspect, by coating a region of the semiconductive body with a metal which forms a surface-barrier contact therewith, applying to the coating a substance which has a melting point below that of the metal and which contains the same semiconductive material as that of which the body is constituted, heating this substance to its melting points, and subsequently cooling the substance below its melting point.

By thus including in the surface-barrier electrode a substance which serves as an additional source of semiconductive material available to enter into solid solution with the metal of the electrode, the tendency for the semiconductive material of the body gradually to enter into solid solution with the material of the electrode at elevated temperatures is greatly reduced or eliminated. As a result, the physical characteristics of the surface-barrier contact thus formed remain substantially invariant, and accordingly the electrical characteristics of a transistor comprising an opposed pair of such contacts remain substantially invariant even when these contacts are maintained at elevated temperatures for extended periods of time.

In a specific embodiment of my invention, my novel form of surface-barrier transistor may be fabricated by electro-plating indium emitter and collector electrodes upon coaxial and opposed regions of a body of n-type germanium, applying a substance now to be described and which has a melting point below that of indium to each of said electrodes, heating this substance to a temperature intermediate its melting point and that of indium, and then cooling the substance below its melting point. As a further feature of my invention, this substance may consist of indium, cadmium and germanium in quantities such that the ratio of the weight of indium to that of cadmium lies in the range of substantially 10.2 to substantially 2.5 inclusive and the amount of germanium lies in the range of substantially 0.02 to substantially 3 percent-by-weight of said substance.

In still another specific embodiment of my invention, the additional semiconductive material is brought into intimate contact with the surface-barrier electrode either by codepositing onto the semiconductive body the semiconductive material and the metal forming the surface-barrier electrode, or alternatively by electrodepositing onto the semiconductive body alternate layers of metal and semiconductive material.

Other advantages and features of my invention will become apparent from a consideration of the following detailed description taken in connection with the accompanying drawings, in which.

In the specific embodiment of the method of my invention now to be described in detail, an improved surface-barrier transistor is fabricated in the following general manner. Opposing surfaces of a wafer of n-type semiconductive material, e.g. n-type germanium, are electrolytically etched in a manner such as to produce coaxial and opposing depressions whose bottom surfaces are spaced from one another by a predetermined small distance. To form the emitter and collector elements of this transistor, a p-type activator metal, for example indium, is then electroplated over specified portions of the respective bottom surfaces of the depressions. Wire leads affording electrical connections to the indium emitter and collector elements are then secured to these elements by means of a special solder consisting of cadmium, indium and germanium and preferably having a composition wherein the ratio of the weight of indium to that of cadmium is substantially equal to three and the amount of germanium lies in the range of substantially 0.1 to 3 percent-by-weight of the solder. The latter solder has a melting point less than that of indium. This solder is melted by applying to it heat sufficient to raise its temperature to one intermediate its melting point and that of indium. After sufficient heat has been applied to cause the solder to flow freely, the structure is cooled below the melting point of the mixture of solder and indium.

Because the cadmium-indium-germanium solder contains a substantial amount of germanium, whereas the indium element to which the solder is applied contains initially substantially no germanium, a germanium concentration gradient exists at the interface of the solder and the indium element, and accordingly the germanium from the solder immediately begins to diffuse into the element. Moreover, because the solid solubility of germanium in indium, though finite, is small, this diffusion of germanium into the element from an auxiliary source, i.e. the solder, substantially reduces the amount of germanium which can diffuse from the germanium wafer into the element. In addition, because a portion of the indium element is dissolved by and mixes with the solder during the time that the solder is melted, the mass of pure indium into which the germanium from the germanium wafer may diffuse is substantially reduced. Accordingly the rate and amount of deleterious dissolution of the semiconductive body by the surface-barrier electrode is greatly reduced, and therefore the resultant transistor may be stored or operated under high temperature conditions for extended periods of time with substantially no change occurring in its electrical characteristics.

More detailed consideration, with reference to the several drawings, is now given to the particular structure and process described above in general terms.

Figure 1:
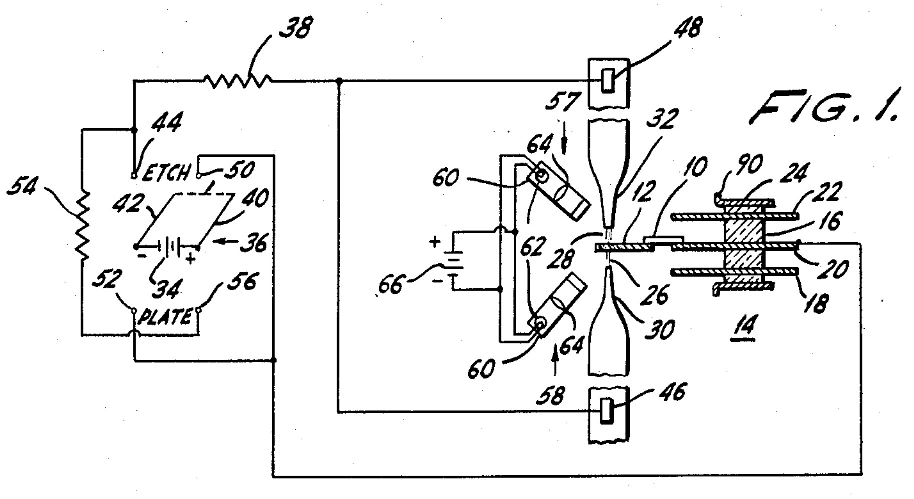
Figure 1 illustrates diagrammatically an electrochemical arrangement suitable for practicing certain steps of my novel method.

Referring now specifically to Figure 1, a nickel base tab 10 is first soldered, in a manner providing an ohmic contact, to one end of a wafer 12 of n-type germanium having a bulk resistivity of approximately 0.8 ohm-centimeter and a minority-carrier lifetime exceeding 10 microseconds. Typically wafer 12 may have a thickness of 0.003 inch, and a length and width of 0.10 inch and 0.05 inch respectively, and the solder securing base tab 10 thereto may be constituted primarily of tin.

The assembly consisting of wafer 12 and base tab 10 is then secured to a mounting structure 14 which comprises a cylindrical glass stem 16 in which are embedded nickel-plated copper stem leads 18, 20 and 22, in parallel coplanar relationship to the axis of the stem, and a flanged metal shell 24 which tightly surrounds the stem. Specifically, the assembly is secured to mounting structure 14 by spot-welding base tab 10 to the central stem lead 20 of structure 14. The germanium wafer 12 is then positioned normal to and between a pair of opposing coaxial jets of electrolytic solution 26 and 28, which are ejected from nozzles 30 and 32 respectively, and which are respectively about 0.003 inch and 0.006 inch in diameter. The composition of the electrolytic solution, which in this specific example contains indium ions, is discussed in greater detail hereinafter.

Wafer 12 having been appropriately positioned, the surfaces thereof impinged by jets 26 and 28 are etched electrolytically by applying to the jets a potential which is negative with respect to wafer 12, and by irradiating with light the surfaces to be etched. The negative potential is supplied to the jets by a source 34 via a double-pole, double-throw switch 36 and a current-limiting resistor 38. More particularly, the positive and negative terminals of source 34 are connected respectively to poles 40 and 42 of switch 36. A first fixed contact 44 of switch 36 is connected by resistor 38 to inert electrodes 46 and 48 which are immersed in the respective streams of electrolytic solution supplying jets 26 and 28, while a second fixed contact 50 is connected to wafer 12 by way of stem lead 20. Switch contact 50 is also connected directly to a third switch contact 52, while switch contact 44 is connected, via a second current-limiting resistor 54, to a fourth switch contact 56. Accordingly, to produce electrolytic etching, switch 36 is closed to its upper pair of contacts, while to produce electrolytic plating, switch 36 is closed to its lower pair of contacts.

The light for irradiating the surface of wafer 12 to be etched is supplied by light sources 57 and 58, respectively, each of which comprises a housing 60, an electric lamp 62 and a condensing lens 64 for directing the light produced by lamp 62 onto the appropriate surface of wafer 12. The lamps 62 are energized by a voltage source 66.

The electrolytic etching of wafer 12 is continued until the distance between the surfaces impinged by jets 26 and 28 has been reduced to approximately 0.00014 inch. Preferably the value of the distance between the etched surface is continuously monitored during etching by arrangements such as the infra-red transmittance measuring system described and claimed in patent application Serial No. 449,347 of R. N. Noyce, filed August 12, 1954, and entitled "Electrical Method and Apparatus," and now Patent No. 2,875,141, or the punch-through voltage measuring system described and claimed in patent application Serial No. 575,159 of W. E. Bradley and J. Roschen, filed March 30, 1956, and entitled "Electrochemical Method and Apparatus," both of which applications are assigned to the assignee of the present application. When the distance between the etched surfaces has been reduced to approximately 0.00014 inch, electrolytic etching is discontinued by opening switch 36 from its upper contacts.

Next indium dots, which are to serve as the emitter and collector elements respectively of the transistor, are caused to deposit electrolytically upon the respective etched surfaces of wafer 12 by closing switch 36 to its lower contacts, thereby applying to wafer 12 a negative potential which serves to discharge indium ions contained in the electrolytic solution impinging the wafer. The electroplating process is continued until a dot approximately 0.003 inch in diameter and approximately 0.0005 inch at its thickest portion, which is to serve as the emitter electrode, has deposited on the surface of wafer 12 impinged by jet 26, and a second dot approximately 0.006 inch in diameter and approximately 0.001 inch at its thickest portion, which is to serve as the collector electrode, has deposited on the surface of wafer 12 impinged by jet 28. At this time, switch 36 is opened, discontinuing the electrolytic process.

In carrying out the above-described electrochemical steps, an electrolytic solution having the following composition has been found to give particularly satisfactory results:

| | |
|---|---|
| Indium sulfate ______ grams | 15.4 |
| Ammonium chloride ______ do | 11 |
| d-Tartaric acid ______ do | 1.5 |
| Sodium salt of ethylene diamine tetra acetic acid ______ grams | 2 |
| Water ______ liter | 1 |

When this solution is utilized, the following additional process conditions have been found to produce smooth etching and adherent plating:

| | |
|---|---|
| Diameter of jet 26 at orifice of nozzle 30 | 0.003 inch. |
| Diameter of jet 28 at orifice of nozzle 32 | 0.006 inch. |
| Pressure under which electrolyte is supplied to nozzle 30 | About 15 pounds per square inch. |
| Pressure under which electrolyte is supplied to nozzle 32 | About 6 to 8 pounds per square inch. |
| Temperature of electrolyte | 25° C. |
| Intensity of etching current supplied to jet 26 | 0.6 to 0.8 milliampere. |
| Intensity of etching current supplied to jet 28 | 0.8 to 1.0 milliampere. |
| Intensity of plating current supplied to jet 26 | 0.1 milliampere. |
| Intensity of plating current supplied to jet 28 | 0.2 milliampere. |

Under these conditions, the time required to etch germanium wafer 12 from an initial thickness of 0.003 inch to a final thickness of about 0.00014 inch is about 90 seconds. Between 30 and 40 seconds are then required to plate indium dots of appropriate size onto the etched surfaces of the wafer. Additional details concerning jet-electrolytic etching are discussed in the above-identified application Serial No. 472,824, of Tiley and Williams, as well as in the above-identified Noyce, and Bradley and Roschen applications. Accordingly it is believed to be unnecessary to discuss the jet electrolytic process further herein.

After the indium dots have been plated onto germanium wafer 12 the entire transistor assembly is first rinsed in distilled water to remove the electrolytic solution, and is then dried by means of an air jet.

Two wire leads, which are to provide connections between stem leads 18 and 22 and the emitter and collector elements, are now prepared by applying a pellet of a special solder onto one end of each of two nickel wires, each having a diameter of approximately 0.002 inch, and then bending each wire into an appropriate shape. More particularly, and in accordance with one aspect of the invention, this special solder contains indium, cadmium and importantly germanium, i.e. the same semiconductive material as that of which semi-conductive wafer 12 is fabricated. Preferably the proportions of the constituents in the solder are such that the weight ratio of indium to cadmium is 3, and the content of germanium is approximately one percent-by-weight of the solder.

This solder may be prepared by first placing, into a refractory, inert, evacuatable vessel (not shown), a measured amount of cadmium-indium eutectic, i.e. an alloy consisting of substantially 25 percent-by-weight of cadmium and substantially 75 percent-by-weight of indium, and then adding, to the eutectic, pulverized germanium in an amount sufficient to constitute approximately one percent-by-weight of the contents of the vessel. Next the vessel into which these constituents have been placed is evacuated and the mixture of cadmium, indium and germanium heated to approximately 400° C. This heating melts the cadmium-indium eutectic and increases the solubility of the melted eutectic for germanium to a value which is sufficiently high to allow all of the added germanium to dissolve into the melt. The melt and germanium are agitated to increase the rate of dissolution of the germanium into the melt and to ensure the homogeneous distribution of the germanium throughout the melt.

After a homogeneous molten mixture of cadmium, indium and germanium is obtained by performing the foregoing steps, a solid solution of these substances is produced by rapidly quenching the melt, for example by plunging the vessel containing it into cold water. The solid mass of solder thus prepared is then divided into pellets of appropriate size. A pellet is then attached to each of the wire leads, for example by immersing the pellets in a flux bath whose temperature slightly exceeds the melting point of the solder, by thrusting a wire lead into such a barely molten pellet and by then withdrawing wire and pellet from the solution. In a specific instance, the flux bath may consist of a solution of 0.5 to 2.0 percent-by-volume of concentrated hydrochloric acid in propylene glycol, and may be maintained at a temperature of 130° C.

Figure 2:
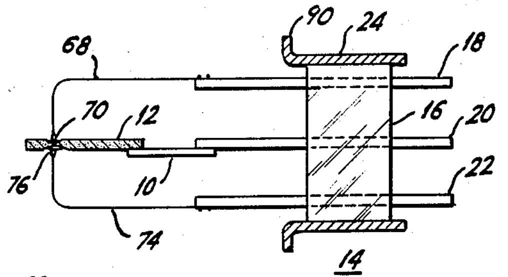
Figure 2 depicts a transistor in an intermediate stage of its fabrication according to my method.
Figure 3:
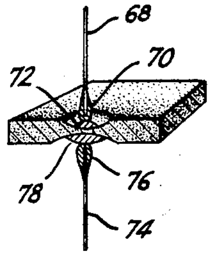
Figure 3 illustrates diagrammatically a portion of the transistor depicted in Figure 2.

When each wire lead has been coated with a pellet of solder, the coated end of each lead is abutted against the appropriate indium dot plated onto semiconductive wafer 12, while the uncoated end of each lead is spot-welded to the appropriate stem lead of mounting structure 14. More particularly, and as shown in Figures 2 and 3, the end of a first lead 68, having a pellet 70 of the aforedescribed solder coated thereon, is abutted against an indium dot 72 which serves as the emitter element of the transistor, while the other end of lead 68 is spot-welded to stem lead 18. Similarly, the end of a second wire lead 74 having a pellet 76 of said solder coated thereon is abutted against an indium dot 78 which serves as the collector element of the transistor, while the other end of lead 74 is spot-welded to stem lead 22.

The solder applied to leads 68 and 74 and abutted against emitter and collector elements 72 and 78 is now melted at a temperature which, according to an essential aspect of the invention, is intermediate the melting point of the solder and that of indium. To this end, and in order to afford precise temperature control of the heat source, there is preferably provided an immersion soldering arrangement which may be of the form described and claimed in the copending patent application Serial No. 514,812 of G. L. Schnable and J. Roschen, filed June 13, 1955, entitled "Circuit Fabrication," and assigned to the assignee of the present aplication, and now Patent No. 2,842,841.

Figure 4:
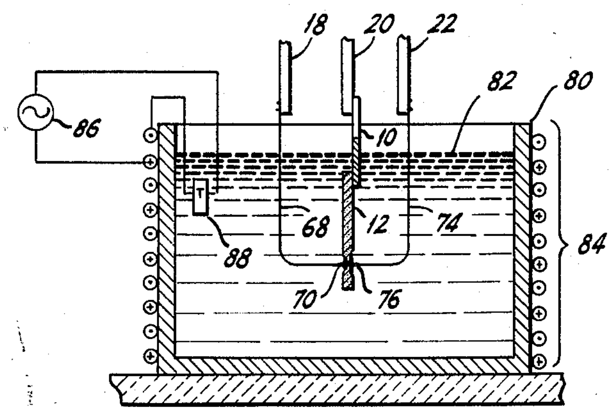
Figure 4 is a diagram of an arrangement suitable for carrying out a further step of my method.

More specifically, and as shown in Figure 4, this immersion soldering arrangement may comprise a vessel 80 which is made of a chemically inert material such as platinum, glass or fused quartz. Vessel 80 contains a liquid 82 having a melting point below that of the solder and a boiling point above that of the solder, and which preferably provides a fluxing action to facilitate the soldering operation. For example, liquid 82 may consist of a solution of 0.5 to 2.0 percent-by-volume of concentrated hydrochloric acid in propylene glycol. The temperature of liquid 82 is maintained at a temperature above the melting point of the solder by means of a heating element, indicated in cross-section at 84, which is arranged to surround vessel 80; the temperature of liquid 82 may typically be established at a value of 135° C. To supply energy to heating element 84, a source of electrical energy 86 is provided, which is connected to element 84 by way of a thermostatic element 88. Thermostatic element 88, which is immersed in liquid 82, is constructed and arranged to close the electrical circuit between source 86 and heating element 84 whenever the temperature of liquid 82 falls below the aforementioned temperature of 135° C.

To perform the soldering step in accordance with my invention, that portion of the transistor structure which includes germanium wafer 12, emitter and collector elements 72 and 78 respectively and wire leads 68 and 74 respectively, having solder pellets 70 and 76 respectively coated thereon and abutted against the appropriate transistor elements, is immersed in liquid 82. Because the temperature of liquid 82 exceeds the melting point of the solder, each of the solder pellets melts and wets the indium dot to which it is applied. Moreover, because the equilibrium content, at 135° C., of indium in the solder exceeds the amount of indium actually contained in pellets 70 and 76, the molten solder dissolves a portion of the indium dot contiguous thereto.

After the solder has had sufficient time to wet the indium element which it abuts, for example after 10 seconds, the transistor structure is removed from liquid 82 and is permitted to cool to room temperature, thereby causing the solder to refreeze. Accordingly, there is formed, on each of the indium surface-barrier elements, a solid solder coating which contains a substantial quantity of germanium. Because this solder is intimately bonded to the indium surface-barrier element, the copious supply of germanium provided by the solder can diffuse readily into the element. Moreover, because as aforementioned, a portion of the indium element dissolves into the solder during the immersion-soldering step, the mass of pure indium available in the surface-barrier electrode to dissolve that portion of wafer 12 contiguous thereto is substantially reduced from its initial value. Since the solubility of germanium in indium at temperatures of the order of 100° C. is relatively small, the mass of germanium from wafer 12 which this smaller amount of pure indium is able to dissolve is correspondingly reduced, and is reduced still further by the diffusion into this pure indium of germanium from the solder.

Accordingly, it is found in practice that only an insubstantial amount of germanium diffuses from wafer 12 into each surface-barrier element and, as a result, the electrical characteristics of the surface-barrier transistor fabricated in accordance with my invention are substantially invariant, even after my novel transistor has been stored or operated at elevated temperatures for extended periods of time.

To complete the transistor, the assembly is first rinsed in distilled water, and is then dried by directing thereagainst a jet of air at room temperature. To remove any chemical contaminants which may have collected on the semiconductive surfaces during the processing thereof, semiconductive wafer 12 is next immersed for 3 seconds in a chemical etchant consisting of:

| | Parts-by-volume |
|---|---|
| Acetic acid | 15 |
| Nitric acid | 8 |
| Hydrofluoric acid | 5 |

Each of the foregoing acids is utilized in its concentrated form.

Thereafter the assembly is rinsed in distilled water to remove the etching solution, and is dried by directing thereagainst first a jet of air at room temperature and thereafter a jet of warmer air, and by vacuum-baking the assembly at a temperature of 85° C. for 15 minutes. Next the assembly is inserted into a metal can (not shown) containing a chemically inert medium which, in a typical case, may be a silicone grease, and finally the unit is hermetically sealed by spot welding the metal can to the flange 90 of shell 24.

It is to be understood that the foregoing specific example of of my novel method for fabricating my novel transistor is merely exemplary, and that I do not intend to limit my invention thereto. In this regard, it is not essential that the depressions formed in semiconductive wafer 12 be produced by electrolytic etching. For example, well-known sand blasting techniques followed by chemical etching may be employed. Moreover the metal coating applied to the excavated surfaces of the semiconductive body need not be electroplated thereon but, for example, may be evaporated thereon. Furthermore, the indium-cadmium-germanium solder need not be coated onto the wire leads as aforedescribed, but alternatively may be introduced between each wire lead and its indium surface-barrier electrode at the appropriate time and in any convenient manner. Moreover, where it is desired to make electrical connections with the surface barrier elements by means other than wire leads, the results according to my invention may be achieved by merely coating the special solder onto the surface-barrier elements in any convenient manner.

In addition, the source of the heat needed to melt the solder need not be an immersion bath, but may be any one of a number of other well-known heat sources. More specifically, the requisite heat may be applied to the solder conductively via the wire lead, or by directing a jet of hot gas toward the solder pellet, or by means of an appropriate radiative heating element.

Moreover, the relative proportions of indium, cadmium and germanium in the special solder need not be the preferred values set forth hereinbefore, but may be any proportions which meet the dual criteria of supplying a sufficient amount of germanium to the indium element to inhibit substantially the dissolution of the semiconductive wafer by the indium element, and in addition of having a melting point appreciably below that of indium. For example, the solder may have proportions in which the ratio of the weight of indium to that of cadmium lies in the range of substantially 10.2 to substantially 2.25 inclusive, and the amount of germanium lies in the range of substantially 0.02 to substantially 3 percent-by-weight of the solder.

Furthermore, it is not essential that the solder comprise the metal cadmium. For example, the solder might alternatively consist of 0.02 percent-by-weight to 3 percent-by-weight of germanium, in combination with 8 percent gallium and 92 percent indium, or with 3 percent silver and 97 percent indium, or with 48 percent tin and 52 percent indium, or with 2 percent zinc and 98 percent indium. All of the foregoing mixtures melt at temperatures appreciably lower than the melting point of indium and contain a concentration of germanium sufficient to inhibit dissolution of the semiconductive body by the adjoining surface-barrier electrode.

In still another significant embodiment of my invention, the surface-barrier electrode is provided with an auxiliary supply of semiconductive material by electrolytically codepositing the semiconductive material and the barrier-producing metal onto the semiconductive wafer, thereby to form a surface-barrier electrode containing a substantial quantity of the semiconductive material. Alternatively, the auxiliary supply of semiconductive material for the surface-barrier electrode may be provided by electroplating onto the semiconductive wafer alternate layers of barrier-producing metal and semiconductive material. As a specific example of the latter form of my method, alternate layers of indium and germanium are jet electroplated onto a germanium wafer by alternately passing, through each of the nozzles, each of two alkaline solutions respectively containing indium and germanium ions and by applying the appropriate plating current to each of these solutions. In one arrangement, the indium ions may be supplied by a solution having the composition:

| | Grams |
|---|---|
| Indium trichloride | 29 |
| Potassium cyanide | 80 |
| Potassium hydroxide | 20 |
| d-Glucose | 30 |

Water to make 1 liter of solution.

The germanium ions may be supplied from a solution containing:

| | Grams |
|---|---|
| Germanium dioxide | 2.6 |
| Potassium hydroxide | 168 |

Water to make 1 liter of solution.

The indium solution is preferably maintained at room temperature, while the germanium solution is preferably maintained at a temperature between 80° C. and 90° C. Current densities up to 30 milliamperes per square centimeter of plated surface may be used in plating the indium, while, in plating the germanium, a smaller current density, e.g. 2 milliamperes per square centimeter, is preferred. A surface-barrier electrode fabricated in the aforedescribed manner contains a quantity of germanium sufficient to inhibit substantially completely the solid-state dissolution of the wafer by the electrode.

Figure 5:
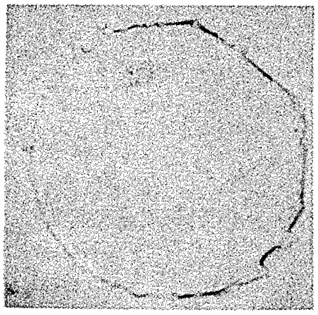
Figures 5 through 8 are reproductions of microphotographs, to which reference is made hereinafter in describing my invention.
Figure 6:
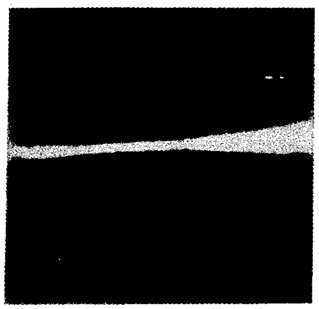
Figure 7:

The new and unusual results achieved by practicing my invention may be better appreciated by a consideration of Figures 5 through 8. Each of these figures is a microphotograph of that portion of the surface of a germanium body to which was initially applied an indium surface-barrier electrode, coated with a solder containing at least indium-cadmium eutectic. In the case of Figures 5 through 7, this solder contained no germanium, while in the case of Figure 8, this solder contained, in accordance with my invention, one percent-by-weight of germanium. Before each photograph was taken, the body, electrode and solder was subjected, in each instance, to a given temperature for a length of time stated hereinafter. Then, the electrode and solder were removed from the germanium body by dipping the body into dilute hydrochloric acid or mercury, in which substances indium and cadmium but not germanium are soluble. In this regard, the surface illustrated in Figure 5 is that of a semiconductive body from which the surface-barrier contact and the solder coated thereon were removed immediately after they were applied, whereas the surfaces shown in the other views are those of bodies which, with their solder-coated surface-barrier electrodes, were exposed to elevated temperatures for extended periods of time before the electrodes and solder were removed.

More particularly, Figure 5, which is a plan view of the base region of a newly fabricated surface-barrier transistor, indicates that initially the germanium to which the surface-barrier electrodes are applied is unpitted. In this regard, the blemish visible in the upper portion of the photograph is merely a speck of dirt which was present on the microscope slide when the photograph was taken.

By contrast, Figure 6 depicts a cross-sectional view of the base region of a surface-barrier transistor fabricated according to prior-art methods and stored for approximately 2900 hours at a temperature of 100° C. The extensive and relatively deep pitting of the surfaces, indicative of the considerable encroachment thereinto of the indium from the surface-barrier electrode, is the significant feature of this view.

Figure 7, which is a plan view of a subelectrode surface of a surface-barrier transistor fabricated by prior-art methods and maintained at 100° C. for 1050 hours, indicates the pattern of the extensive encroachment of indium into the germanium body. The pits, formed in the germanium surface by the solid state dissolution of germanium from this surface into the contiguous surface-barrier electrode, appear in the photograph as polygons having clearly delineated straight sides.

Figure 8:
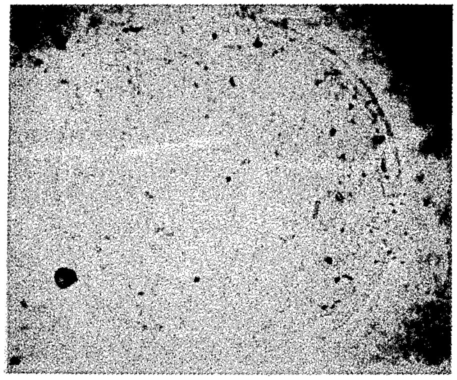

Figure 8 is a plan view of a subelectrode surface of a surface-barrier transistor fabricated according to my invention and also maintained at a temperature of 100° C. for 1050 hours. In marked contrast to the surface depicted in Figure 7, the surface shown in Figure 8 is characterized by an extreme sparsity of the clearly delineated polygons indicative of solid-state dissolution of the germanium surface into the abutting electrode, and by the small sizes of any polygons that do exist. This enormous reduction in the number and sizes of the pits is attributable to the provision in accordance with my invention of a germanium-bearing solder which is applied to the surface-barrier electrode and which acts as an auxiliary source of germanium available for diffusion into this electrode.

Accordingly, by my invention, I have provided an improved surface-barrier transistor and a method for fabricating it. My transistor is characterized by the fact that its electrical parameters are substantially unaffected by its extended exposure to high temperatures. It should be understood that my improved surface-barrier transistor, and my novel method for fabricating it are not limited to transistors constructed of n-type germanium wafers and indium electrodes but also include transistors constituted of other surface-barrier forming metals and n-type semiconductive bodies, as well as p-type semiconductive bodies.

Moreover my invention contemplates both those surface-barrier transistors in which the auxiliary semiconductive material is uniformly dispersed throughout the electrode, and those transistors in which this material is non-uniformly dispersed therethrough. In addition, while the foregoing discussion has been directed specifically to transistors, it will be clear to those skilled in the art that my invention is not limited thereto, but may be applied profitably to other semiconductive devices.

While I have described my invention by means of specific examples and in a specific embodiment, I do not wish to be limited thereto, for obvious modifications will occur to those skilled in the art without departing from the scope of my invention.

What I claim is:

1. A semiconductive device comprising a body of a semiconductive material consisting principally of germanium and a surface-barrier rectifying electrode applied to said body, said rectifying electrode having as a major constituent a metal forming a surface barrier when applied to said material and having germanium as a minor constituent, and the portion of said electrode contacting said body consisting predominantly of said barrier-forming metal.

2. A signal-translating device comprising a body of n-type germanium, surface-barrier emitter and collector electrodes applied to said body and a base electrode affixed to said body, each of said surface-barrier electrodes being composed of a substance consisting primarily of indium and secondarily of germanium, and the portion of said each electrode contacting said body consisting predominantly of indium.

3. A signal-translating device comprising a body of n-type germanium, surface-barrier emitter and collector electrodes applied to said body and a base electrode affixed to said body, each of said surface-barrier electrodes being composed of a substance consisting of indium and germanium, said germanium being present in an amount falling in the range of 0.02 to 3.0 percent-by-weight inclusive of said substance, and the portion of said each electrode contacting said body consisting predominantly of indium.

4. A signal-translating device comprising a body of n-type germanium, a base electrode affixed to said body, surface-barrier emitter and collector electrodes composed of indium and applied to said body, first and second conductive leads, and a solder affixing said first and second leads to said emitter and collector electrodes respectively, said solder being a rapidly quenched alloy consisting of cadmium, indium and germanium, and said germanium being present in said solder in an amount lying in the range of 0.02 to 3 percent-by-weight inclusive.

5. A signal-translating device comprising a body of n-type germanium, a base electrode affixed to said body, surface-barrier emitter and collector electrodes composed of indium and applied to said body, first and second conductive leads, and a solder affixing said first and second leads to said emitter and collector electrodes respectively, said solder consisting of indium and cadmium in substantially eutectic proportions and germanium in an amount lying in the range of 0.02 to 3 percent-by-weight inclusive of said solder.

6. A signal-translating device comprising a body of n-type germanium, a base electrode affixed to said body, surface-barrier emitter and collector electrodes composed of indium and applied to said body, first and second wire leads, and a solder affixing said first and second leads to said emitter and collector electrodes respectively, said solder being a rapidly quenched alloy consisting of substantially 74.3 percent-by-weight of indium, substantially 24.7 percent-by-weight of cadmium and substantially 1 percent-by-weight of germanium.

7. A signal-translating device comprising a body of n-type germanium, surface-barrier emitter and collector electrodes composed of indium and applied to said body, and a substance applied to each of said electrodes, said substance being a rapidly quenched alloy consisting of indium, cadmium and germanium, the ratio in said substance of the weight of said indium to that of said cadmium lying in the range of substantially 10.2 to substantially 2.25 inclusive, and the amount of germanium in said substance lying in the range of substantially 0.02 to substantially 3 percent-by-weight of said substance.

8. A signal-translating device comprising a body of n-type germanium, surface-barrier emitter and collector electrodes composed of indium and applied to said body, and a substance coated upon each of said electrodes, said substance being a rapidly quenched alloy consisting of indium, cadmium and germanium, the ratio in said substance of the weight of said indium to that of said cadmium being substantially equal to three, and the amount of said germanium lying in the range of substantially 0.02 to substantially 3 percent-by-weight of said substance.

9. A signal-translating device comprising a body of n-type germanium, surface-barrier emitter and collector electrodes composed of indium and applied to said body, and a substance coated upon each of said electrodes, said substance consisting of indium, cadmium and germanium, the ratio in said substance of the weight of said indium to that of said cadmium being substantially equal to three, and the amount of said germanium lying in the range of substantially 0.1 to substantially 3 percent-by-weight of said substance.

10. A signal-translating device comprising a body of n-type germanium, surface-barrier emitter and collector electrodes composed of indium and applied to said body, and a substance coated upon each of said electrodes, said substance consisting of indium, cadmium and germanium, the ratio in said substance of the weight of said indium to that of said cadmium being substantially equal to three and the amount of said germanium being approximately one percent-by-weight of said substance.

11. A semiconductive device according to claim 2, wherein said germanium contained by said substance is present therein in a concentration less than three percent-by-weight.

12. A semiconductive device according to claim 1, wherein said surface-barrier electrode comprises a plurality of alternate layers respectively consisting essentially of said metal and germanium.

13. A semiconductive device according to claim 1, wherein said surface-barrier electrode comprises both a layer consisting substantially only of said metal and having one surface thereof positioned in contact with a surface of said body, and a layer of a substance containing germanium and having a surface thereof positioned in contact with a surface of said metal layer other than said one surface.

14. A signal-translating device comprising a body of n-type germanium, a surface-barrier electrode composed essentially of indium and applied to said body, and a rapidly quenched alloy consisting essentially of cadmium, indium and germanium and applied to said electrode.

15. A signal-translating device according to claim 14, wherein the concentration in said alloy of said germanium lies in the range of substantially 0.02 percent-by-weight to substantially 3 percent-by-weight.

16. A signal-translating device according to claim 14, wherein the ratio in said alloy of the weight of said indium to the weight of said cadmium lies in the range of substantially 10.2 to substantially 2.25 and the concentration in said alloy of said germanium lies in the range of substantially 0.02 percent-by-weight to substantially 3 percent-by-weight of said alloy.

17. A signal-translating device according to claim 16, wherein said ratio is substantially equal to 3.

References Cited in the file of this patent

UNITED STATES PATENTS

| | | |
|---|---|---|
| 2,603,693 | Kircher | June 15, 1952 |
| 2,701,326 | Pfann et al. | Feb. 1, 1955 |
| 2,770,586 | Davis | Nov. 13, 1956 |
| 2,771,410 | Russel et al. | Nov. 20, 1956 |
| 2,825,667 | Mueller | Mar. 4, 1958 |
| 2,829,422 | Fuller | Apr. 8, 1958 |
| 2,831,787 | Emeis | Apr. 22, 1958 |